US011604757B2

(12) United States Patent
Lobo et al.

(10) Patent No.: US 11,604,757 B2
(45) Date of Patent: Mar. 14, 2023

(54) PROCESSING DATA IN MEMORY USING AN FPGA

(71) Applicant: International Business Machines Corporation, Armonk, NY (US)

(72) Inventors: Preetham M. Lobo, Bangalore (IN); Gaurav Sulagodu Venkatagiri, Bengaluru (IN); Siva Sundar A, Bangalore (IN); Vinod Bussa, Hyderabad (IN)

(73) Assignee: International Business Machines Corporation, Armonk, NY (US)

( * ) Notice: Subject to any disclaimer, the term of this patent is extended or adjusted under 35 U.S.C. 154(b) by 903 days.

(21) Appl. No.: 16/513,764

(22) Filed: Jul. 17, 2019

(65) Prior Publication Data
US 2021/0019280 A1 Jan. 21, 2021

(51) Int. Cl.
*G06F 15/00* (2006.01)
*G06F 17/00* (2019.01)
*G06F 12/00* (2006.01)
*G06F 15/78* (2006.01)
*G06F 17/16* (2006.01)
*G06F 12/0879* (2016.01)
*G06F 30/34* (2020.01)

(52) U.S. Cl.
CPC ...... *G06F 15/7839* (2013.01); *G06F 12/0879* (2013.01); *G06F 17/16* (2013.01); *G06F 30/34* (2020.01)

(58) Field of Classification Search
CPC .. G06F 15/7839; G06F 30/34; G06F 12/0879; G06F 17/16
See application file for complete search history.

(56) References Cited

U.S. PATENT DOCUMENTS

| 9,996,912 | B2 | 6/2018 | Richmond | |
|---|---|---|---|---|
| 2020/0301736 | A1* | 9/2020 | Kutschbach | .......... G06F 9/4881 |
| 2022/0131579 | A1* | 4/2022 | Xu | ........................ H04L 5/0048 |

FOREIGN PATENT DOCUMENTS

| CN | 101763445 A | 6/2010 |
|---|---|---|
| CN | 101807215 B | 11/2011 |
| CN | 104680236 A | 6/2015 |

OTHER PUBLICATIONS

Cong et al., "Best-Effort FPGA Programming: A Few Steps Can Go a Long Way", arXiv:1807.01340v1 [cs.AR] Jul. 3, 2018, 13 pages.
Mantovani et al., "Handling Large Data Sets for High-Performance Embedded Applications in Heterogeneous Systems-on-Chip", CASES '16, Oct. 1-7, 2016, Pittsburgh, PA, USA, DOI: http://dx.doi.org/10.1145/2968455.2968509, 10pages.

(Continued)

*Primary Examiner* — Justin R Knapp
(74) *Attorney, Agent, or Firm* — David K. Mattheis; Maeve Carpenter

(57) ABSTRACT

Processing data in memory using a field programmable gate array by reading a first portion of a data set to a burst block having a first data format, transforming a sub-portion of the first portion, to an element block having a second data format, processing the sub-portion yielding a first results set, transforming the first results set to the first data format of the burst block, and writing the first results set to the burst block.

20 Claims, 5 Drawing Sheets

(56) References Cited

OTHER PUBLICATIONS

Mell et al., "The NIST Definition of Cloud Computing", Recommendations of the National Institute of Standards and Technology, Special Publication 800-145, Sep. 2011, 7 pages.
Shawahna et al., "FPGA-based Accelerators of Deep Learning Networks for Learning and Classification: A Review", IEEE Access, arXiv:1901.00121v1 [cs.NE] Jan. 1, 2019 , Digital Object Identifier 10.1109/ACCESS.2018.2890150.DOI, 41 pages.

\* cited by examiner

PROCESSING DATA IN MEMORY USING AN FPGA

BACKGROUND

The disclosure relates generally to moving data between system memory and a field programmable gate array (FPGA) accelerator. The disclosure relates particularly to using iterative processing to avoid stalling when processing requested data from memory using an FPGA.

Big data processing tasks can invoke algorithms which are computationally intensive. These tasks can benefit from the use of customizable logic systems including field programmable gate array circuits. FPGA elements provide the benefit of parallel processing of some computationally intensive tasks.

SUMMARY

Aspects of the invention disclose methods, systems and computer readable media associated with processing data in memory using a field programmable gate array by reading a first portion of a data set, having a first data format, to a burst block, transforming a sub-portion of the first portion, to an element block having a second data format, processing the element block sub-portion yielding a first results set, transforming the first results set to the format of the burst block, and writing the first results set back to the burst block.

DETAILED DESCRIPTION

Figure 1:
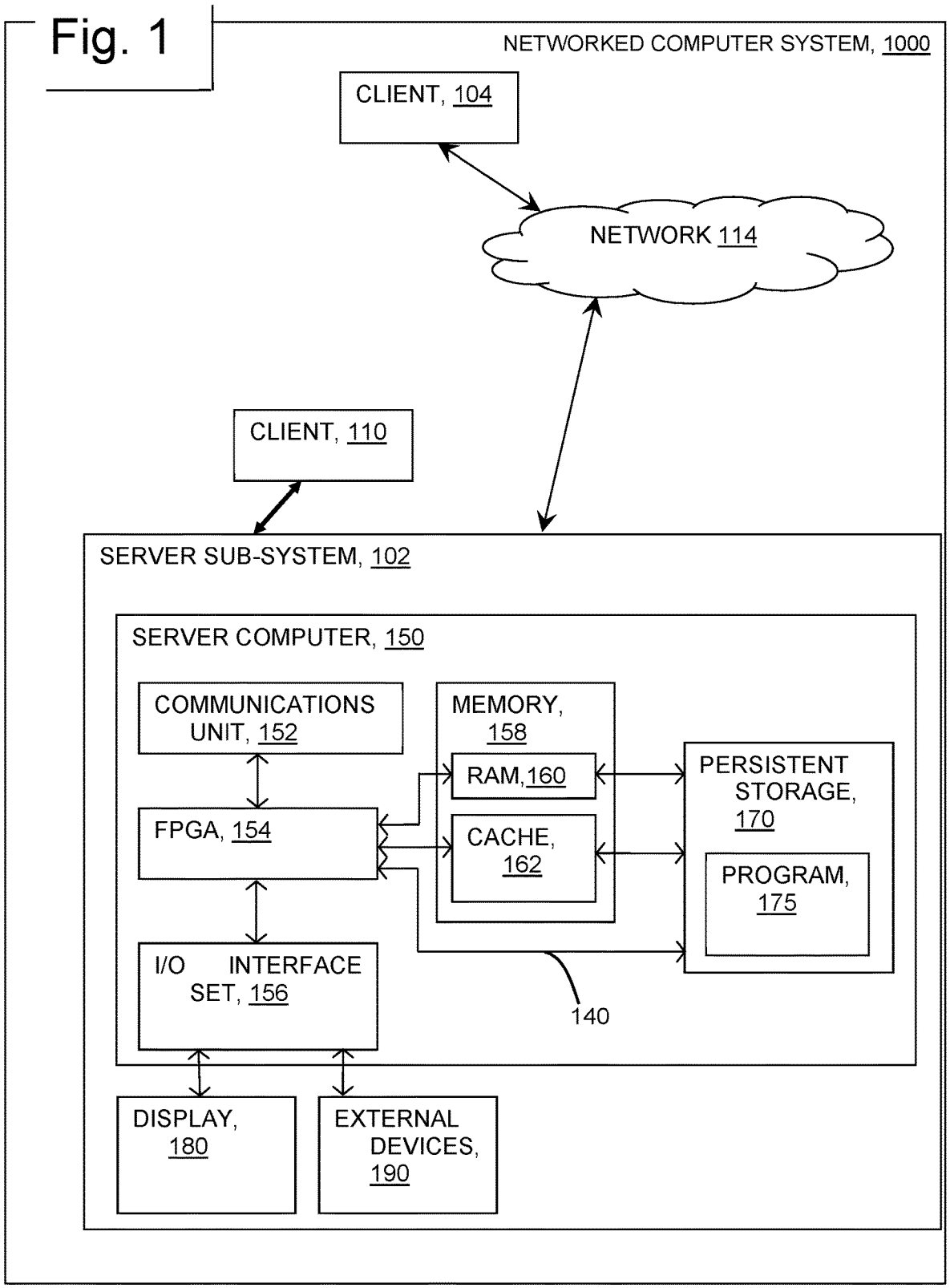
FIG. 1 provides a schematic illustration of a system, according to an embodiment of the invention.

Advanced data processing techniques use evaluation algorithms which can benefit from the application of FPGA accelerators. Computationally intensive matrix decomposition algorithms, such as singular value decomposition (SVD) algorithms, can be applied to data sets to determine, among other things, the principal components of the data set.

A real m×n matrix can be factored as: $A=U\Sigma V^T$, where U is an m×m orthogonal matrix with columns equal to the eigenvectors of $AA^T$, V is an n×n orthogonal matrix with columns equal to the eigenvectors of $A^T A$, and $\Sigma$ is a diagonal m×n matric having positive real diagonal entries, and where the diagonal entries decrease in value from entry (1,1) to entry (m,n). The rank of the original matrix can be determined as the last non-zero value of the $\Sigma$ matrix main diagonal.

The SVD factor matrices can be determined to identify the best least squares fit of the data of the original matrix, or to find the best fit defining the relationship between one variable as a function of other variables as set forth in the values of the original matrix. SVD can be applied to a data set to determine the principal components of the data set to identify factors actually influencing a dependent variable in a data set containing noisy data.

FPGA accelerators have finite memory capacities and can only process data quantities up to their memory limits. The size of big data sets can exceed the memory capacities of the FPGA data processing systems making it difficult to process the elements of the big data set.

Iteratively processing the big data set to accommodate the memory capacity limitations of the available data processing system can be computationally expensive due to the number of memory access operations required by the processing. What is needed is a methodology to apply algorithms to a big data set efficiently without the need for excessive, and computationally expensive, memory access operations.

In an embodiment, an SVD algorithm is applied to a data set in memory yielding the U$\Sigma$V constituent matrices associated with the data set. In an embodiment, a first portion of the U$\Sigma$V matrices of the processed data set is read into a burst block location of the FPGA in a first data format associated with the FPGA memory. The first portion consists of an array, or matrix, sized to the memory limits of the FPGA. In this embodiment, the portion includes N rows of data and the number of columns per row to the capacity of the FPGA. The U$\Sigma$V matrices can include many more than N rows or columns of data. Additional rows and columns of data will be read in as future blocks after the initial block has been evaluated by the steps of the disclosed invention.

In this embodiment, the method proceeds, processing the U$\Sigma$V matrices as follows: for p=0 to N−1, the $p^{th}$ row of each of the U$\Sigma$V matrices is read. For q=p+1 to N−1, the $q^{th}$ row of each of the U$\Sigma$V matrices and the off-diagonal values, those values which are not situated along the diagonal of the matrix, of the U$\Sigma$V matrices are read. For values of q less than or equal to (N/2)−1, the qth row of the U$\Sigma$V matrices and the off-diagonal values of the U$\Sigma$V matrices in the burst block are read. For values of q greater than (N/2)−1, (the critical boundary of the burst block data) the qth row of the U$\Sigma$V matrices and the off-diagonal values of the U$\Sigma$V matrices are read from memory. In this manner, the values of the original burst block are iteratively processed and replaced without the need for additional memory calls until the critical boundary is reached for values of q.

The $p^{th}$ row, $q^{th}$ row, and off-diagonal values, are transformed from the burst block data format, such as an N×N format, to an element block data format for additional processing. The transformation yields a rectangular element block, such as 2×N, including the values read in from the $p^{th}$ rows, $q^{th}$ rows, and off-diagonal values of the burst block. The rectangular element blocks are stored in an element block memory. The element blocks are processed according to the overall data set processing goals. Sub-functions are applied to the values of the element block, yielding calculated results associated with the element block. Sub-functions can include statistical functions applied to the element block values, or other data processing functions as required by the data set processing goals. The calculated results of the application of the sub-functions to the element block are transformed from the 2×N format of the element block to the N×N format of the burst block and then written to the burst block as new values of the $p^{th}$ row and the off-diagonal rows of the U$\Sigma$V matrices of the bust block, replacing the previously read values of these matrix locations. This process continues for each value of p and q, until p=N, at which point the next block of data from the data set is read into the burst block for processing. The process provides for the iterative reading, transformation into an element block, processing of the element block, transforming the processed results back to the format of the burst block and writing the processed results back to the burst block location, across the data set until the entire data set has been processed.

As an example, a 4×4 data array is processed using an SVD algorithm yielding 4×4 UΣV constituent matrices which are loaded into the burst block. These matrices are then processed as described above with p values progressing from 0 to 3, and q progressing from 1 to 3. Values of the UΣV matrices for q>1, are read from memory, while the UΣV matrix values for q=1 are read from the original burst block values. The processing yields a set of 2×2 element block matrices which are then used as inputs to the sub-function processing. The sub-function processing yields processed element block 2×2 matrices which are then transformed into rows of a 4×4 matrix and written int the original data 4×4 matrix.

In an embodiment, 32×32 sized data portions of the UΣV matrices are read into the burst block, these portions are iteratively processed into 2×32 element blocks upon which sub-functions are completed. The $p^{th}$ row of the burst block is then over written with the new values from the processed element block.

In an embodiment, as the values of the UΣV matrices are evaluated, the rank of the original burst block data is determined according to the last non-zero value of the Σ matrix. The determined rank is then used to define a critical boundary in the data of the UΣV matrices in the processing. In an embodiment, the critical boundary is defined as that point where q=(N/2)−1. The critical boundary is dependent upon the algorithm and reflects those points in the UΣV matrices where critical changes, such as the change from a non-zero value to zero along the diagonal of the Σ matrix, occur. At the point of the critical boundary, new data is read in from memory to the burst block as the data currently in the burst block is beyond the critical boundary and of little interest in terms of the current algorithm.

FIG. 1 provides a schematic illustration of exemplary network resources associated with practicing the disclosed inventions. The inventions may be practiced in the processors of any of the disclosed elements which process an instruction stream. As shown in the figure, a networked Client device 110 connects wirelessly to server sub-system 102. Client device 104 connects wirelessly to server sub-system 102 via network 114. Client devices 104 and 110 each comprise data processing programs (not shown) together with sufficient computing resource (processor, memory, network communications hardware) to execute the program. As shown in FIG. 1, server sub-system 102 comprises a server computer 150. FIG. 1 depicts a block diagram of components of server computer 150 within a networked computer system 1000, in accordance with an embodiment of the present invention. It should be appreciated that FIG. 1 provides only an illustration of one implementation and does not imply any limitations with regard to the environments in which different embodiments can be implemented. Many modifications to the depicted environment can be made.

Server computer 150 can include FPGAs 154, memory 158, persistent storage 170, communications unit 152, input/output (I/O) interface(s) 156 and communications fabric 140. Communications fabric 140 provides communications between cache 162, memory 158, persistent storage 170, communications unit 152, and input/output (I/O) interface(s) 156. Communications fabric 140 can be implemented with any architecture designed for passing data and/or control information between processors (such as microprocessors, communications and network processors, etc.), system memory, peripheral devices, and any other hardware components within a system. For example, communications fabric 140 can be implemented with one or more buses.

Memory 158 and persistent storage 170 are computer readable storage media. In this embodiment, memory 158 includes random access memory (RAM) 160. In general, memory 158 can include any suitable volatile or non-volatile computer readable storage media. Cache 162 is a fast memory that enhances the performance of FPGA(s) 154 by holding recently accessed data, and data near recently accessed data, from memory 158.

Program instructions and data used to practice embodiments of the present invention, e.g., the data processing program 175, are stored in persistent storage 170 for execution and/or access by one or more of the respective FPGA(s) 154 of server computer 150 via cache 162. In this embodiment, persistent storage 170 includes a magnetic hard disk drive. Alternatively, or in addition to a magnetic hard disk drive, persistent storage 170 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 170 may also be removable. For example, a removable hard drive may be used for persistent storage 170. Other examples include optical and magnetic disks, thumb drives, and smart cards that are inserted into a drive for transfer onto another computer readable storage medium that is also part of persistent storage 170.

Communications unit 152, in these examples, provides for communications with other data processing systems or devices, including resources of client computing devices 104, and 110. In these examples, communications unit 152 includes one or more network interface cards. Communications unit 152 may provide communications through the use of either or both physical and wireless communications links. Software distribution programs, and other programs and data used for implementation of the present invention, may be downloaded to persistent storage 170 of server computer 150 through communications unit 152.

I/O interface(s) 156 allows for input and output of data with other devices that may be connected to server computer 150. For example, I/O interface(s) 156 may provide a connection to external device(s) 190 such as a keyboard, a keypad, a touch screen, a microphone, a digital camera, and/or some other suitable input device. External device(s) 190 can also include portable computer readable storage media such as, for example, thumb drives, portable optical or magnetic disks, and memory cards. Software and data used to practice embodiments of the present invention, e.g., data processing program 175 on server computer 150, can be stored on such portable computer readable storage media and can be loaded onto persistent storage 170 via I/O interface(s) 156. I/O interface(s) 156 also connect to a display 180.

Display 180 provides a mechanism to display data to a user and may be, for example, a computer monitor. Display 180 can also function as a touch screen, such as a display of a tablet computer.

Figure 2:
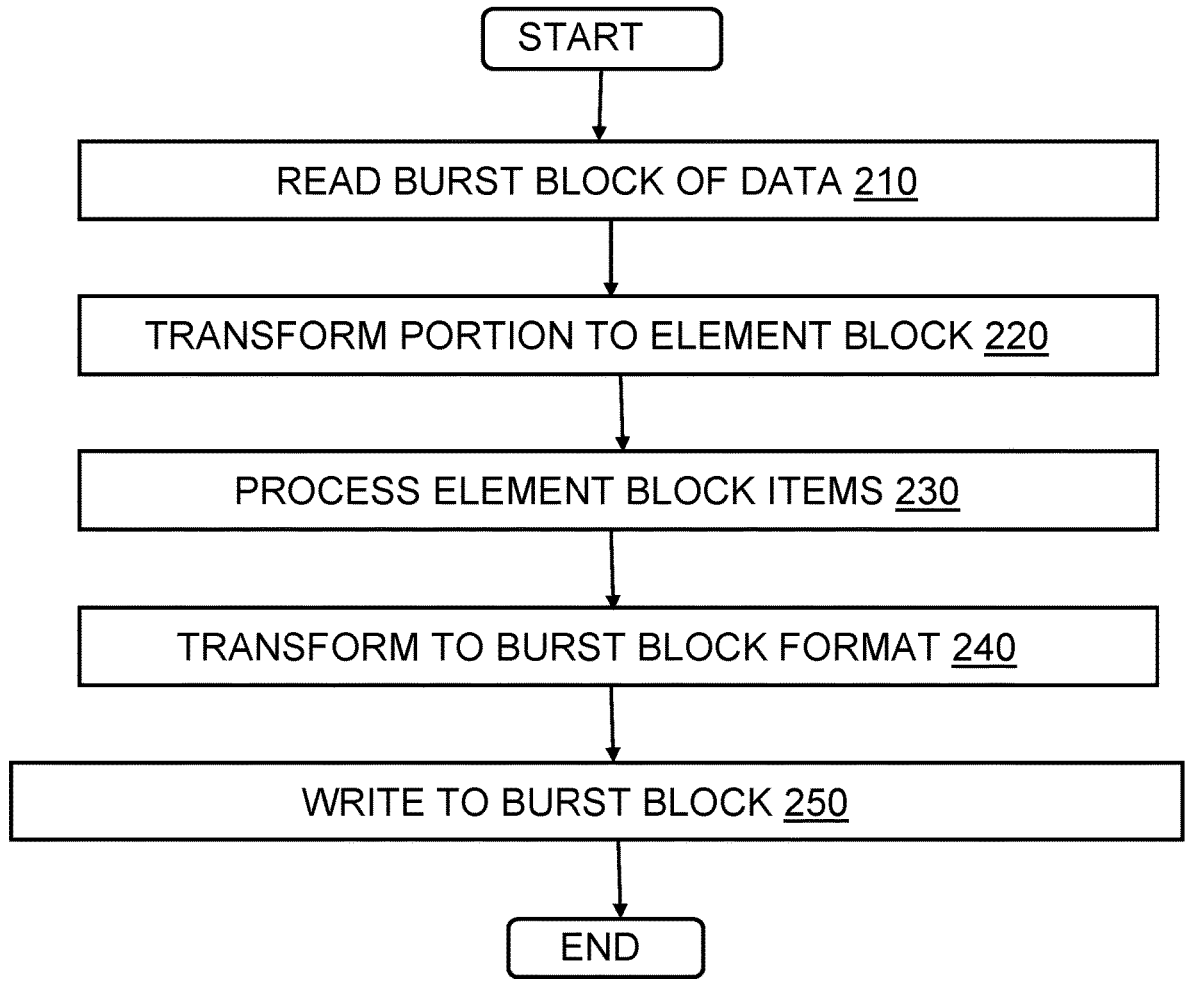
FIG. 2 provides a flowchart depicting an operational sequence, according to an embodiment of the invention.

FIG. 2 provides a flowchart 200, illustrating exemplary activities associated with the practice of the disclosure. After program start, at 210, a block of data is read from memory by data processing program 175 into the burst block portion of the FPGA 154. The burst block of data is iteratively processed according to the goals of the data processing program 175, yielding a series of element blocks at 220, which are processed using a sub-function of the data processing program 175 at 230. Each processed element block is transformed by data processing program 175 to the format of the burst block at 240, and the results of the processed and transformed element block are written to the burst block location by data processing program 175 at 250.

Figure 3:
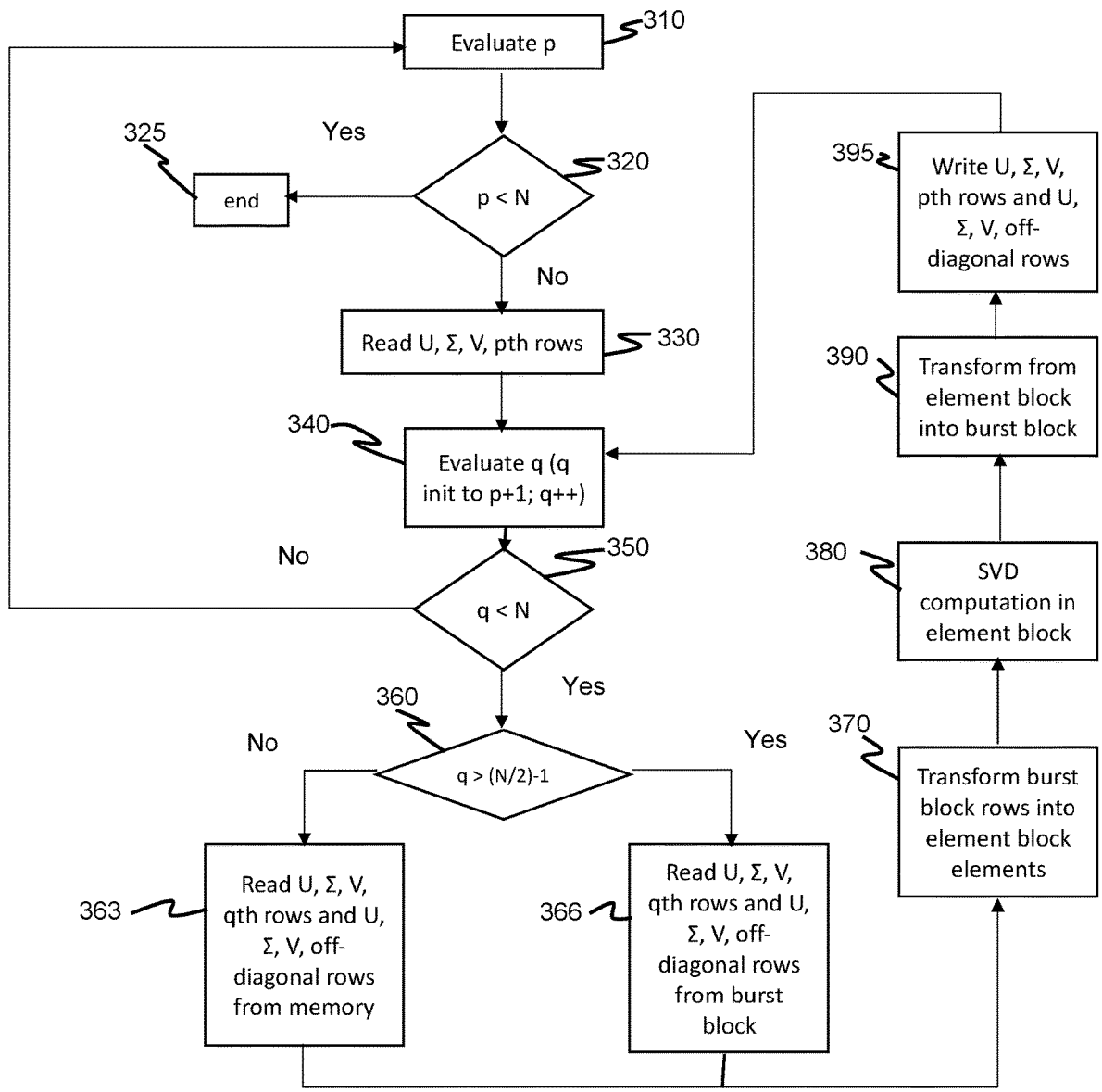
FIG. 3 provides a flowchart depicting an operational sequence, according to an embodiment of the invention.

FIG. 3 provides a flowchart illustrating operational steps associated with processing burst bocks of data. After data has been read to the FPGA burst block location, processing begins with evaluating p, at 310, for values of p from 0 to N−1 at 320. The method proceeds, processing the UΣV matrices as follows: for p=0 to N−1, the $p^{th}$ row of each of the UΣV matrices is read at 330. Values of q are evaluated at 340, with q initialized as p+1. For q=p+1 to N−1 at 350, the $q^{th}$ row of each of the UΣV matrices and the off-diagonal values, those values which are not situated along the diagonal of the matrix, of the UΣV matrices are read. For values of q less than or equal to (N/2)−1 at 360, the qth row of the UΣV matrices and the off-diagonal values of the UΣV matrices in the burst block are read at 366. For values of q greater than (N/2)−1, (the critical boundary of the burst block data) the qth row of the UΣV matrices and the off-diagonal values of the UΣV matrices are read from memory at 363. In this manner, the values of the original burst block are iteratively processed and replaced without the need for additional memory calls until the critical boundary is reached. At 370, the values which have been read are transformed from the burst block format to an element block format. At 380 an SVD sub-function is used to process the element block, yielding a processed element block. At 390, the processed element block values are transformed from the element block format to the burst block format. At 395, the transformed element block values of the $p^{th}$ row and off-diagonal row values, are written to the burst block replacing the original $p^{th}$ row and off-diagonal row values of the burst block. Processing continues until p reaches N, at which point a new burst block is read into the FPGA 154 from memory 158.

The present invention may be a system, a method, and/or a computer program product at any possible technical detail level of integration. The invention may be beneficially practiced in any system, single or parallel, which processes an instruction stream. The computer program product may include a computer readable storage medium (or media) having computer readable program instructions thereon for causing a processor to carry out aspects of the present invention.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 4:
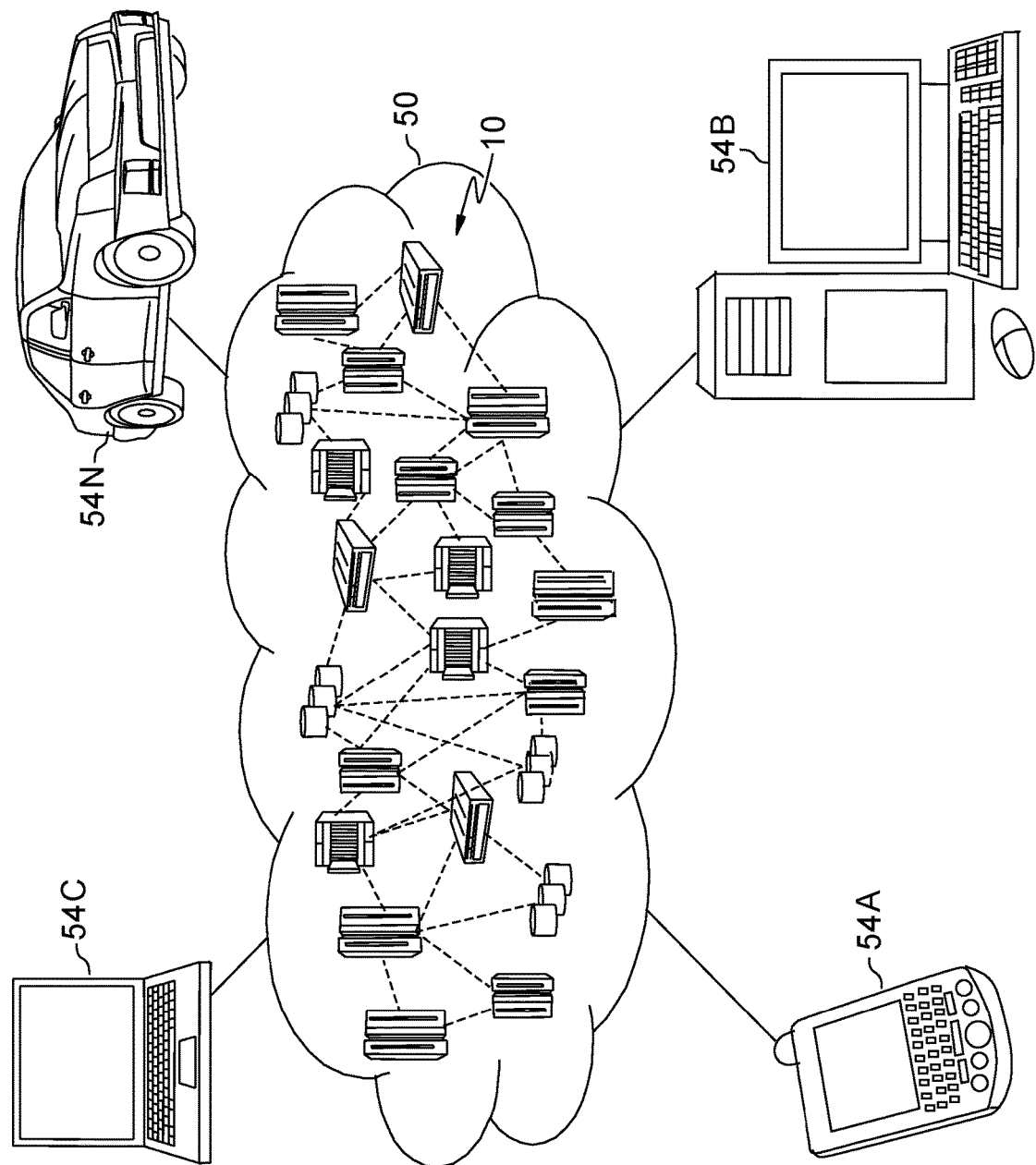
FIG. 4 depicts a cloud computing environment, according to an embodiment of the invention.

Referring now to FIG. 4, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 4 are intended to be illustrative only and that computing nodes 10 and cloud computing environment 50 can communicate with any type of computerized device over any type of network and/or network addressable connection (e.g., using a web browser).

Figure 5:
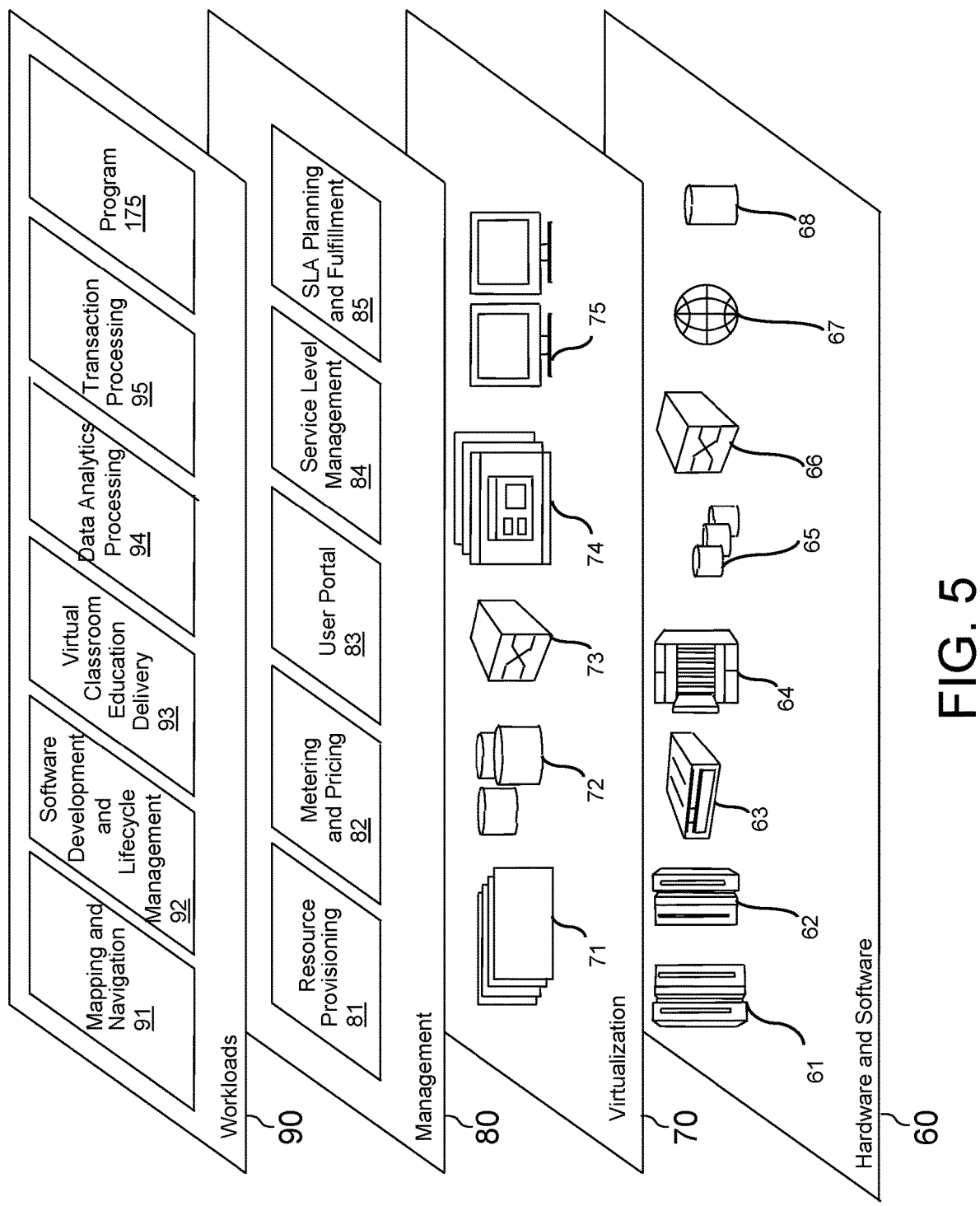
FIG. 5 depicts abstraction model layers, according to an embodiment of the invention.

Referring now to FIG. 5, a set of functional abstraction layers provided by cloud computing environment 50 (FIG. 4) is shown. It should be understood in advance that the components, layers, and functions shown in FIG. 5 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and machine learning program 175.

The present invention may be a system, a method, and/or a computer program product at any possible technical detail level of integration. The invention may be beneficially practiced in any system, single or parallel, which processes an instruction stream. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer implemented method for processing data in memory using a field programmable gate array, the method comprising:
   reading a first portion of a data set to a burst block having a first data format;
   transforming a sub-portion of the first portion to an element block having a second data format;
   processing the sub-portion, wherein the processing yields a first results set;
   transforming the first results set to the first data format of the burst block; and
   writing the first results set to the burst block replacing the sub-portion of the first portion.

2. The computer implemented method according to claim 1, wherein the first portion comprises an array.

3. The computer implemented method according to claim 2, further comprising calculating a singular value decomposition of the first portion.

4. The computer implemented method according to claim 3, further comprising iteratively processing rows of constituents of the singular value decomposition.

5. The computer implemented method according to claim 3, further comprising iteratively identifying a boundary within a constituent of the singular value decomposition.

6. The computer implemented method according to claim 5, further comprising reading additional data associated with the boundary.

7. The computer implemented method according to claim 3, wherein transforming the sub-portion comprises transforming portions of constituents of the singular value decomposition.

8. A computer program product for processing data in memory using a field programmable gate array, the computer program product comprising one or more computer readable storage devices and stored program instructions on the one or more computer readable storage devices, the stored program instructions comprising:
   program instructions for reading a first portion of a data set to a burst block having a first data format;
   program instructions for transforming a sub-portion of the first portion to an element block having a second data format;
   program instructions for processing the sub-portion, wherein the processing yields a first results set;
   program instructions for transforming the first results set to the first data format of the burst block; and
   program instructions for writing the first results set to the burst block replacing the sub-portion of the first portion.

9. The computer program product according to claim 8, wherein the first portion comprises an array.

10. The computer program product according to claim 9, the stored program instructions further comprising program instructions for calculating a singular value decomposition of the first portion.

11. The computer program product according to claim 10, the stored program instructions further comprising program instructions for iteratively processing rows of constituents of the singular value decomposition.

12. The computer program product according to claim 10, the stored program instructions further comprising iteratively identifying a boundary within a constituent of the singular value decomposition.

13. The computer program product according to claim 12, the stored program instructions further comprising program instructions for reading additional data associated with the boundary.

14. The computer program product according to claim 10, wherein transforming the sub-portion comprises transforming portions of constituents of the singular value decomposition.

15. A computer system processing data in memory using a field programmable gate array, the computer system comprising:
   one or more computer processors;
   one or more computer readable storage devices;
   stored program instructions on the one or more computer readable storage devices for execution by the one or more computer processors, the stored program instructions comprising:
     program instructions for reading a first portion of a data set to a burst block having a first data format;
     program instructions for transforming a sub-portion of the first portion to an element block having a second data format;
     program instructions for processing the sub-portion, wherein the processing yields a first results set;
     program instructions for transforming the first results set to the first data format of the burst block; and
     program instructions for writing the first results set to the burst block replacing the sub-portion of the first portion.

16. The computer system according to claim 15, wherein the first portion comprises an array.

17. The computer system according to claim 16, the stored program instructions further comprising program instructions for calculating a singular value decomposition of the first data portion.

18. The computer system according to claim 17, the stored program instructions further comprising program instructions for iteratively processing rows of constituents of the singular value decomposition.

19. The computer system according to claim 17, the stored program instructions further comprising iteratively identifying a boundary within a constituent of the singular value decomposition.

20. The computer system according to claim 17, wherein transforming the sub-portion comprises transforming portions of constituents of the singular value decomposition.

* * * * *